United States Patent [19]

Siegel

[11] Patent Number: 4,746,877
[45] Date of Patent: May 24, 1988

[54] DIRECT-COUPLED WIDEBAND AMPLIFIER

[75] Inventor: Barry Siegel, San Jose, Calif.

[73] Assignee: Elantec, Milpitas, Calif.

[21] Appl. No.: 911,517

[22] Filed: Sep. 25, 1986

[51] Int. Cl.$^4$ ............................................. H03F 3/45
[52] U.S. Cl. ..................... 330/255; 330/156; 330/257; 330/260; 330/311
[58] Field of Search ............... 330/156, 255, 257, 259, 330/260, 288, 291, 292, 300, 311; 323/315, 316

[56] References Cited

U.S. PATENT DOCUMENTS

| | | | |
|---|---|---|---|
| 2,761,917 | 9/1956 | Aronson | 179/171 |
| 2,773,945 | 12/1956 | Theriault | 179/171 |
| 3,434,069 | 3/1969 | Jones | 330/30 |
| 3,493,881 | 2/1970 | Zuch | 330/24 |
| 3,638,132 | 1/1972 | Trilling | 330/69 |
| 3,668,543 | 6/1972 | Bailey | 330/30 |
| 3,769,605 | 10/1973 | Long | 330/30 |
| 3,868,583 | 2/1975 | Krabbe | 330/30 |

OTHER PUBLICATIONS

Jaeger, "A High Output Resistance Current Source", *IEEE Journal of Solid-State Circuits*, Aug. 1974 pp. 192-194.

Primary Examiner—James B. Mullins
Attorney, Agent, or Firm—A. C. Smith

[57] ABSTRACT

An improved gain stage includes a pair of differentially-connected, matched, bipolar transistors and local positive feedback from the output to the collector electrode of one input transistor to provide D.C. balance and substantially enhanced voltage gain.

9 Claims, 2 Drawing Sheets

DIRECT-COUPLED WIDEBAND AMPLIFIER

FIELD OF THE INVENTION

This invention relates to differential amplifiers, and more specifically to a cascoded amplifier circuit having positive feedback for high gain and wide bandwidth.

BACKGROUND AND SUMMARY OF THE INVENTION

Conventional operational amplifiers are known to employ several transistor gain stages to establish high open-loop voltage gain. In order to achieve high gain in a differential gain stage, conventional, cascoding is often used to provide good D.C. balance and higher output impedance. One disadvantage of direct-coupled differential cascoded gain stages is that the bias circuitry increases the complexity of the gain stage. In addition, the signal current passes through all transistors in the circuit with concomitant time delays which contribute to instability when feed-back is included around the circuit.

In accordance with the preferred embodiment of the present invention, an improved differential gain stage achieves the benefits of a cascode configuration without causing signal current to pass through an additional transistor. The present circuit provides DC balance and local positive feedback for high gain, wide bandwidth operation.

DESCRIPTION OF THE PREFERRED EMBODIMENT

Figure 1:
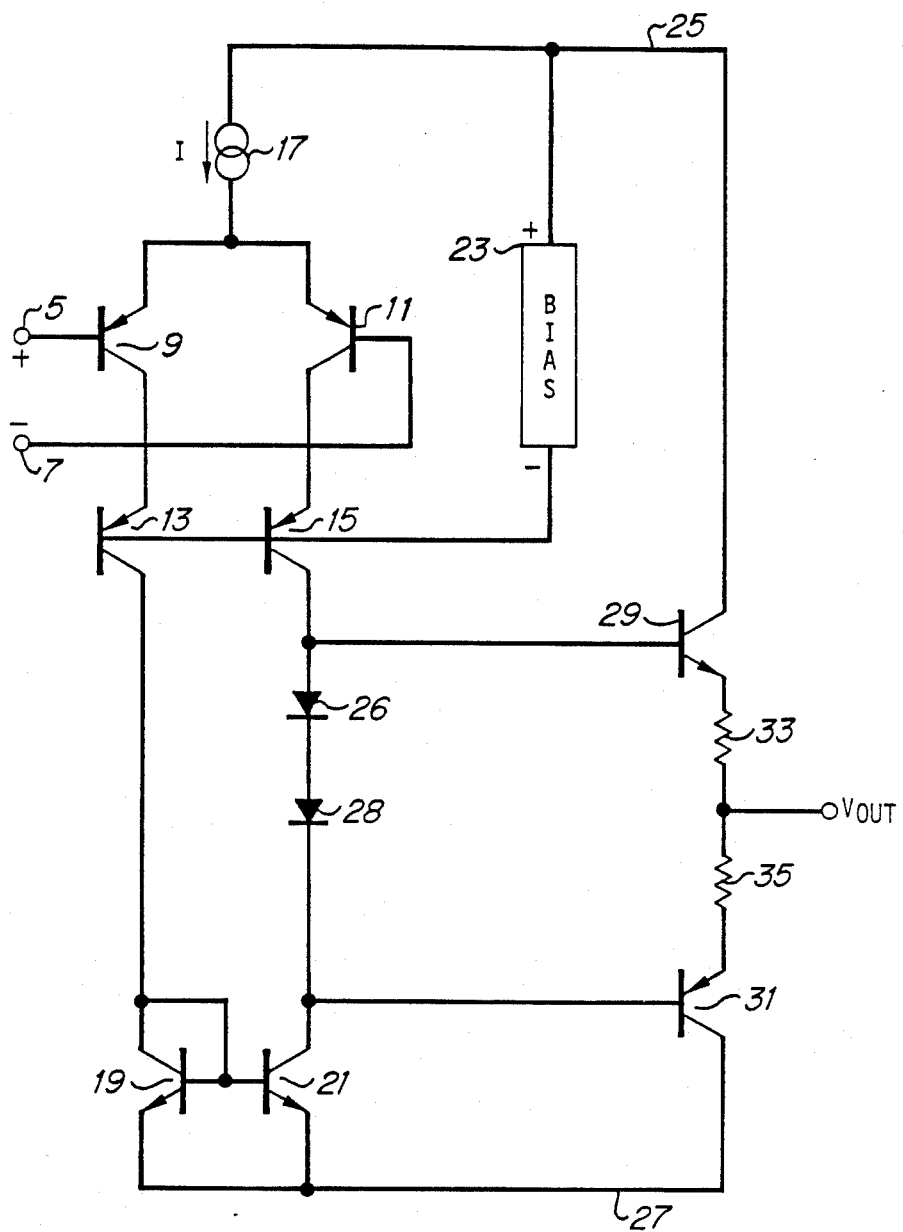
FIG. 1 is a schematic diagram of a conventional cascode differential amplifier.

Referring now to FIG. 1, there is shown a conventional cascode differential amplifier including a pair of PNP transistors 9,11 connected in differential common-emitter configuration with differential base inputs and with collectors connected, respectively, to the emitters of another pair of transistors 13, 15. A current source 17 is connected from the supply line 25 to the common emitters of transistors 9 and 11, and a conventional 'current mirror' circuit including a pair of NPN transistors 19 and 21 is connected from the other supply line 27 to the transistors 13 and 15 to supply balanced collector currents thereto under signal operating conditions. Bias circuitry 23 is connected from the supply line 25 to the bases of transistors 13 and 15. A pair of diodes 26, 28 are serially connected in forward-biased relationship in the collector path of transistor 15 to provide sufficient voltage drop thereacross to bias the transistors 29, 31 in the output stage. Specifically, the complementary NPN and PNP transistors 29, 31 have their collectors connected to opposite supply lines 25, 27 and their emitters connected together through series resistors 33 and 35, and have their bases connected to opposite ends of the diodes 26, 28. Thus, the forward-biased voltage drop across diodes 26 and 28 equals the base-emitter voltages of the transistors 29, 31 and IR voltage drops across resistors 33, 35. Differential voltage signals applied to the inputs 5 and 7 are thus amplified in transistors 9 and 11, and the resultant signal is applied to the bases of transistors 29, 31 which operate substantially as emitter followers to produce the amplified version of the differential voltage inputs at the unction of the resistors 33, 35.

One disadvantage of the conventional cascode differential amplifier circuit of the type illustrated in FIG. 1 is that the transistors exhibit finite transit times or delays and the signal current passes through all transistors in the circuit. The associated delay times cause instability problems such as oscillations. In addition, even using matched pairs of transistors throughout the conventional circuit does not compensate for the Early effect (i.e. the influence of collector-emitter voltage upon hole-density gradient at the emitter, and hence upon transconductance) which adversely affects common-mode signal conversion and other undesirable differential amplification parameters.

In such prior art circuits, the collector-to-emitter voltage of the gain transistors 9, 11 circuits do not vary with the output voltage. However, the collector-to-emitter voltage of transistor 15 does vary with the output voltage, and this modulates the alpha gain factor of transistor 15. This results in a change in the collector current of transistor 11 and a corresponding change in the base-emitter voltage of transistor 11. Since the collector-emitter voltage of transistor 13 does not change with output voltage, the base-emitter voltage of transistor 9 does not change. Therefore, dVos/dVout is finite and the gain is reduced. In typical prior art circuits, the maximum gain that can be extracted from the stage is between 1,000 and 3,000.

Figure 2:
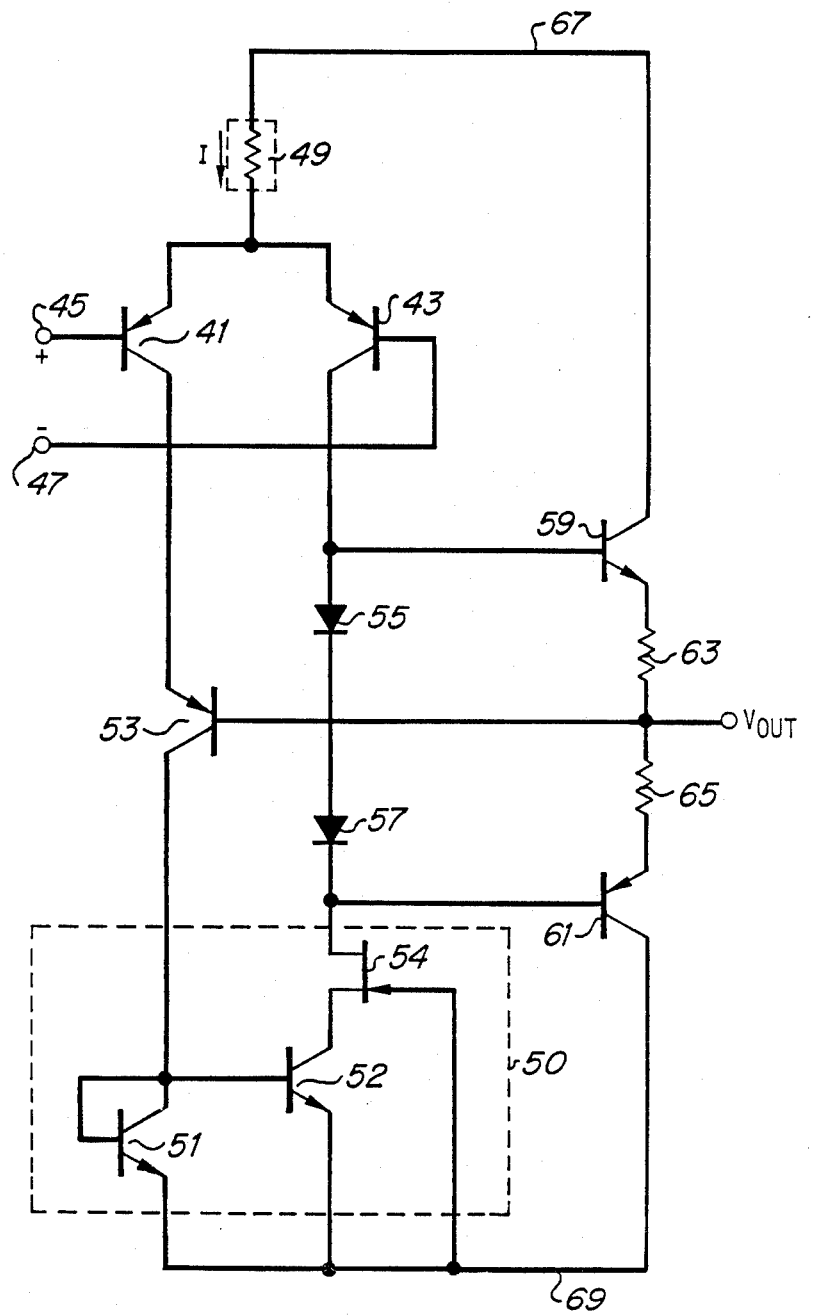
FIG. 2 is a schematic diagram of the preferred embodiment of the present invention.

In accordance with the preferred embodiment illustrated in FIG. 2, there is shown a schematic diagram of the differential amplifier of the present invention which provides improved D.C. balance and substantially enhanced signal gain. The pair of PNP transistors 41, 43 are connected with base electrodes disposed to receive differential signals at inputs 45, 47 and with the emitter electrodes coupled together to receive bias current from a substantially constant-current supply 49. Constant-current supply 49 may be closely approximated by a resistor of large value from a bias potential on conductor 67 of high value. Ideally, these input transistors 41, 43 should have voltage hain characteristics as a function of collector-emitter voltages which are substantially identical to reduce the impact of the Early effect upon the amplified signals. Also, it is preferred to maintain substantially identical currents in the input transistors, and this is achieved by including a 'current mirror' circuit 50 in the collector circuits of the input transistors 41 and 43, specifically, the 'current mirror' circuit includes a pair of NPN transistors 51 and 52 connected in common-emitter configuration to the bias supply conductor 69 with the base electrodes of the two transistors connected to the collector electrode of transistor 51, and with an N-channel Junction Field-Effect Transistor (JFET) 54 connected in common-gate configuration to the collector electrode of transistor 52. The emitter electrode of transistor 53 is connected to the collector electrode of transistor 41 which receives the non-inverting input at its base electrode 45. The collector of transistor 53 is coupled to the diode-connected transistor 51 of the 'current mirror' circuit 50 and the base of transistor 53 is connected to the output node of the amplifier. Transistor 52 is connected to the collector of inverting transistor 43 through the JFET 54 and the diodes 55 and 57 which are serially connected in the forward conduction direction.

Alternatively, with transistor 51 connected as a forward-conducting diode, the collector of transistor 53 is essentially connected (and may be directly connected) to the bias potential on conductor 69. The transistor 52 and JFET 54 may thus be replaced with a substantially constant-current source (for example, a resistor of large value connected to the supply potential of high value on conductor 69).

In operation for identical, matched transistors 51 and 52, the collector current in transistor 51 is equal to the collector current in transistor 52. However, the collector-to-emitter voltage of transistor 51 is constrained to equal the base-to-emitter voltage of transistor 52 (approximately 0.6 volts for silicon transistors) while the collector-to-emitter voltage of transistor 52 (without JFET 54 present) can range several tens of volts. This possible mismatch of collector-to-emitter voltages of transistors 51 and 52 would, therefore, result in a mismatch of collector currents in these transistors. The JFET 54 is connected with its gate electrode connected to supply 69, its drain electrode connected to the cathode of diode 57 and the base electrode of PNP transistor 61, and its source electrode connected to the collector of transistor 52. The JFET 54 is purposely chosen to operate with a gate-to-source voltage substantially in the range of the base-to-emitter voltage of transistor 51. Since the gate-to-source voltage of JFET 54 remains essentially constant with variations in output voltage, the currents in transistors 51 and 52 remain substantially constant. In addition, the JFET 54 operating in the common-gate configuration increases the impedance level at its drain. Both effects increase the gain of the overall stage while balancing the collector-to-emitter voltages of transistors 51 and 52 which, thereby minimizes drift in the 'current mirror' circuit.

The pair of complementary conductivity-type transistors 59, 61 are arranged as the output stage with the emitter electrodes coupled together through series resistors 63 and 65, and with the collector electrodes coupled to receive bias current from bias supply conductors 67 and 69. The base electrodes of transistor 59, 61 are coupled to receive the signals appearing across the serially-connected diodes 55 and 57, and the amplified output appearing at the common junction of resistors 63 and 65 is applied to the base electrode of transistor 53.

In operation, it is preferred to operate the input transistors 41 and 43 at substantially the same collector-emitter voltages to reduce the effects of non-linear gain characteristics as a function of collector-emitter voltages. The base electrode of transistor 53 is biased from the output voltage and this causes the collector-emitter voltages of the input transistors 41, 43 to be identical. For purposes of analysis, it can be shown that the voltage on the collector electrode of transistor 43 (VC43) is:

$$V_{out} + V_{B-E59}$$

(where resistor 63 is small), and the voltage on the emitter electrodes is $V_1$. Therefore, $$V_1 - V_{out} - V_{B-E59} = V_{C-E43}.$$

Similarly, the voltage on the collector electrode of transistor 41 (VC41) is:

$$V_{out} + V_{B-E53}$$

and;

$$V_1 - V_{out} - V_{B-E53} = V_{C-E41}.$$

For small resistor 63, $V_{B-E53}$ approximately equals $V_{B-E59}$, and thus:

$$V_{C-E41} = V_{C-E43}.$$

The resulting D.C. balance assures in improved offset voltage for the input stage and, therefore, for the overall amplifier.

In addition, the circuit of FIG. 2 achieves the benefits of cascoding gain stages without causing the signal current to pass through an additional transistor with concomitant time delay. Also, the overall voltage gain is increased by transistor 53 which provides positive feedback from the output to the collector of transistor 41. Thus, as the output voltage varies, transistor 53 maintains the collector-to-emitter voltage of transistor 41 equal to the collector-to-emitter voltage of transistor 43. For identical, matched transistors 41, 43, the voltage gain approaches infinity, even for transistors with Early-effect characteristics and resulting finite output impedances. This can be shown by the analysis that follows.

The base-emitter voltage of a bipolar transistor is given by:

$$V_{BE} = \left(\frac{kT}{q}\right) \ln\left[\left(\frac{I_c}{I_s}\right) \cdot \left(\frac{V_a + V_{CE}}{V_a}\right)\right] \quad (1)$$

Where:
  k = Boltzman's Constant
  T = Temperature °K.
  q = Chage on the electron
  Ic = Collector Current
  Is = Reverse Saturation Current
  VCE = Collector to Emitter Voltage
  Va = Early (effect) voltage The offset voltage of two identical bipolar junction transistors connected as a differential amplifier and operating at the same collector current is given by:

$$V_{os} = V_{BE1} - V_{BE2} \quad (2)$$

$$= \left(\frac{kT}{q}\right) \ln\left(\frac{V_a}{V_a + V_{CE1}} - \frac{V_a}{V_a + V_{CE2}}\right)$$

The gain of the differential amplifier may be expressed as:

$$A_v = \frac{1}{\frac{dV_{os}}{dV_{out}}} \quad (3)$$

Differentiating equation (2) and simplifying yields:

$$\frac{dV_{os}}{dV_{out}} \cong \left(\frac{kT}{q(V_a + V_{CE})}\right) \cdot \left(\frac{dV_{CE2}}{dV_{out}} - \frac{dV_{CE1}}{dV_{out}}\right) \quad (4)$$

In accordance with the present invention, the action of transistor 53 is such that:

$$\frac{dV_{CE41}}{dV_{out}} = \frac{dV_{CE13}}{dV_{out}} \quad (5)$$

Hence:

$$\frac{dV_{os}}{dV_{out}} \to 0 \quad (6)$$

Therefore:

$$Av = \frac{1}{\frac{dV_{os}}{dV_{out}}} \to \infty \quad (7)$$

In practical circuits, voltage gains in excess of 50,000 and high unity gain-bandwidth may be realized using the circuit configuration of the present invention.

Therefore the circuit of the present invention operates with fewer components in the signal path to implement the gain stage; i.e., biasing circuit for a conventional cascode is eliminated along with the additional transistor in the signal path. The phase delay to the output in the present invention is minimized by the elimination of the additional transistor and, hence, the stability of the circuit is improved. Also, the D.C. offset voltage of the input stage is improved since the collector-emitter voltages of the differential pair are forced to be identical. The gain of the input stage is therefore increased, typically by an order of magnitude to two orders of magnitude, by positive feedback in the circuit.

I claim:

1. An amplifier circuit comprising:
   a first pair of transistors of one conductivity type, each having emitter, base, and collector electrodes with the base electrodes coupled to receive applied inverting and non-inverting signals, and with the emitter electrodes coupled together to receive bias current;
   a pair of serially-connected diodes coupled in current conduction direction to the collector electrode of the one of said first pair of transistors that receives inverting signal;
   a second pair of transistors of complementary conductivity types, each having emitter, base, and collector electrodes with the emitter electrodes coupled together to supply an output and with the collector electordes coupled to receive bias current and with the base electrodes coupled to receive the signals appearing across said pair of diodes;
   a fifth transistor of said one conductivity type having an emitter electrode coupled to the collector electrode of the other of said first pair of transistors and having a base electorde and a collector electrode;
   circuit means coupled to the collector electrode of the fifth transistor and to the serially-connectd diodes for conducting bias current and or maintaining the current in the collector electrode of the fifth transistor and in the serially-connected diodes substantially equal; and
   means coupling the base electrode of the fifth transistor to receive said output from the emitter electrodes of the second pair of transistors.

2. An amplifier as in claim 1 comprising:
   a source of bias potentials on separate conductors;
   substantially constant-current means coupling the emitter electrodes of said first pair of transistors to receive one bias potential on a conductor of said source; and wherein said circuit means is connected to receive another bias potential on another conductor of said bias supply.

3. An amplifier as in claim 2 wherein said substantially constant-current means includes a resistor connected between said emitter electrodes of said first pair of transistors and said one bias potential.

4. An amplifier as in claim 2 wherein said circuit means includes substantially constant current means connected between the serially-connected diodes and said another bias potential on said another conductor of said bias supply.

5. An amplifier as in claim 2 wherein the emitter electrodes of said second pair of transistors are coupled together through a pair of serially-connected resistors with said output provided at the common junction of said resistors.

6. An amplifier as in claim 1 wherein:
   said circuit means includes a third pair of transistors of the opposite conductivity type, each having emitter electrodes connected in common to receive bias current and having base electrodes coupled together and having collector electrodes coupled respectively to the collector electrode of the fifth transistor and to the serially-connected diodes to form a current mirror which maintains the current in each collector electrode thereof substantially constant.

7. An amplifier as in claim 6 comprising:
   a source of bias potentials on separate conductors;
   substantially constant-current means coupling the emitter electrodes of said first pair of transistors to receive one bias potential on a conductor of said source; and
   wherein said emitter electrodes of said third pair of transistors and the collector electrode of the transistor of the second pair which is of said one conductivity type are coupled to receive another bias potential on another conductor of the bias supply.

8. An amplifier circuit comprising:
   a differential input stage including a pair of transistors of one conductivity type with base electrodes connected to receive inverting and non-inverting applied signals, and having emitter electrodes connected together to receive bias signal, and having collector electrodes;
   an output stage having substantially unity voltage gain coupled to receive signal appearing on the collector electrode of the transistor in the input stage which has the inverting input;
   a gain stage of substantially unity voltage gain coupled to receive the output of the output stage and coupled to the collector electrode of the transistor in the input stage which has the non-inverting input for supplying to said collector electrode the current which is conducted through said gain stage; and
   bias means coupled to the emitter electrodes of the transistors in the input stage, and to said gain stage and to the collector electrode of the transistor which has the inverting input for maintaining the currents in the collector electrodes of the transistors in the input stage substantially constant.

9. An amplifier as in claim 8 wherein;
   the transistors in the input stage have voltage gain characteristics as a function of emitter-collector voltage thereacross which are substantially equal.

* * * * *